United States Patent
Miyamoto

(10) Patent No.: US 11,563,416 B2
(45) Date of Patent: Jan. 24, 2023

(54) COMMON MODE CHOKE COIL

(71) Applicant: Murata Manufacturing Co., Ltd., Kyoto-fu (JP)

(72) Inventor: Masashi Miyamoto, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 310 days.

(21) Appl. No.: 16/899,288

(22) Filed: Jun. 11, 2020

(65) Prior Publication Data

US 2021/0012949 A1 Jan. 14, 2021

(30) Foreign Application Priority Data

Jul. 10, 2019 (JP) .............................. JP2019-128019

(51) Int. Cl.
*H03H 7/42* (2006.01)
*H01F 27/28* (2006.01)
*H01F 17/04* (2006.01)
*H01F 27/32* (2006.01)
*H01F 27/29* (2006.01)
*H01F 17/00* (2006.01)

(52) U.S. Cl.
CPC ............ *H03H 7/427* (2013.01); *H01F 17/04* (2013.01); *H01F 27/2823* (2013.01); *H01F 27/29* (2013.01); *H01F 27/324* (2013.01); *H01F 2017/0093* (2013.01)

(58) Field of Classification Search
CPC ............................ H03H 7/427; H01F 27/2823
USPC ......................................... 333/177, 181, 185
See application file for complete search history.

(56) References Cited

U.S. PATENT DOCUMENTS

| 2016/0379751 | A1 | 12/2016 | Ashizawa et al. |
| 2017/0062122 | A1 | 3/2017 | Kanbe et al. |
| 2017/0200548 | A1* | 7/2017 | Takagi ................ H01F 27/2828 |

FOREIGN PATENT DOCUMENTS

| CN | 106486255 A | 3/2017 |
| JP | 2014-120730 A | 6/2014 |

OTHER PUBLICATIONS

An Office Action mailed by China National Intellectual Property Administration dated Nov. 23, 2021 which corresponds to Chinese Patent Application No. 202010473951.6 and is related to U.S. Appl. No. 16/899,288 with English language translation.

* cited by examiner

*Primary Examiner* — Rakesh B Patel
(74) *Attorney, Agent, or Firm* — Studebaker & Brackett PC

(57) ABSTRACT

A common mode choke coil is configured in which end portions of first and second wires are connected to first and second terminal electrodes, end portions of third and fourth wires are connected to third and fourth terminal electrodes, and at least a part of each of the first, third, fourth and second wires is wound around a winding core portion to form first, second, third and fourth layers. Also, a common mode choke coil is configured in which end portions of first and second wires are connected to first and second terminal electrodes, end portions of a third wire are connected to third and fourth terminal electrodes, and at least a part of each of the first, third, and second wires is wound around a winding core portion to form first, second, and third layers.

20 Claims, 6 Drawing Sheets

COMMON MODE CHOKE COIL

CROSS-REFERENCE TO RELATED APPLICATION

This application claims benefit of priority to Japanese Patent Application No. 2019-128019, filed Jul. 10, 2019, the entire content of which is incorporated herein by reference.

BACKGROUND

Technical Field

This disclosure relates to a common mode choke coil, and more particularly to a wire wound type common mode choke coil having a structure in which a plurality of wires is wound around a winding core portion provided on a core.

Background Art

With reference to FIG. 9 and FIG. 10, a widely used configuration of a common mode choke coil 31 will be described.

As illustrated in FIG. 9, the common mode choke coil 31 includes a core 32, and a first wire 33 and a second wire 34 which respectively constitute inductors. The common mode choke coil 31 may include a top plate 45.

The core 32 includes a winding core portion 35, a first flange portion 36 provided on a side of a first end 38 of the winding core portion 35 in an axial direction, and a second flange portion 37 provided on a side of a second end 39 opposite to the first end 38 side.

The first flange portion 36 is provided with a first terminal electrode 41 and a third terminal electrode 43, and the second flange portion 37 is provided with a second terminal electrode 42 and a fourth terminal electrode 44. As seen in the position of the terminal electrodes 41 to 44, the common mode choke coil 31 is illustrated in a posture that the mounting surface to face the mounting substrate side is directed upward in FIG. 9.

Each of the first wire 33 and the second wire 34 is helically wound in parallel from the first end 38 side to the second end 39 side around the winding core portion 35. End portions of the first wire 33 are connected to the first terminal electrode 41 and the second terminal electrode 42 respectively, and end portions of the second wire 34 are connected to the third terminal electrode 43 and the fourth terminal electrode 44 respectively.

The common mode choke coil 31 having the configuration described above is provided with an equivalent circuit illustrated in FIG. 10. In FIG. 10, elements corresponding to those illustrated in FIG. 9 are denoted by the same reference numerals.

As illustrated in FIG. 10, the common mode choke coil 31 includes a first inductor 46 constituted by the first wire 33 connected to the first terminal electrode 41 and the second terminal electrode 42, and a second inductor 47 constituted by the second wire 34 connected to the third terminal electrode 43 and the fourth terminal electrode 44.

Although not clearly illustrated in FIG. 9, the first wire 33 is wound around a peripheral surface of the winding core portion 35 to form a first layer, and the second wire 34 is wound to form a second layer which locates in an outer peripheral side of the first layer while a portion thereof is fitted in a recess formed between adjacent turns of the first wire 33. In this manner, the first inductor 46 and the second inductor 47 are magnetically coupled to each other.

In the common mode choke coil 31 described above, when signal frequency inputted thereto increases, mode conversion characteristics may deteriorate. The mode conversion characteristics indicate a ratio of outputted common mode noise to inputted differential signal component, where the common mode noise is converted from the inputted differential signal component. For example, in Japanese Unexamined Patent Application Publication No. 2014-120730, disruption in balance of stray capacitance (distributed capacitance) generated between different turns of the first wire 33 and the second wire 34 is described as a cause of the problem.

Therefore, as illustrated in FIG. 11, in a common mode choke coil 31a described in Japanese Unexamined Patent Application Publication No. 2014-120730, a following winding mode of wires 33 and 34 is adopted.

In FIG. 11, the cross section of the first wire 33 is hatched to clarify the distinction from the second wire 34. In addition, in the cross section of each of the first wire 33 and the second wire 34 illustrated in FIG. 11, turn numbers "1" to "12" are given. The numbers are counted from the first end 38 side where the first flange portion 36 of the winding core portion 35 is located.

In FIG. 11, among portions of the first wire 33 and the second wire 34 wound around the winding core portion 35, portions that are located in a front side of the winding core portion 35 are schematically illustrated by solid lines, and portions that are hidden by the winding core portion 35 are schematically illustrated by broken lines, respectively. In FIG. 11, with the wires 33 and 34, not all of the portions located in the front side of the winding core portion 35 and not all of the portions that are hidden by the winding core portion 35 are illustrated.

Regions in the first wire 33 and the second wire 34 are classified as follows based on winding states with reference to FIG. 11.

(1) A first winding region A in which the first wire 33 is positioned closer to the first end 38 side than the second wire 34 while being adjacent to each other in the same respective turn numbers of the first wire 33 and the second wire 34.

(2) A second winding region B in which the first wire 33 is positioned closer to the second end 39 side than the second wire 34 while being adjacent to each other in the same respective turn numbers of the first wire 33 and the second wire 34.

(3) A switching region C, located between the first winding region A and the second winding region B, in which turns of the first wire 33 and turns of the second wire 34 are switched in positional relation by crossing the first wire 33 and the second wire 34. The first winding region A, the switching region C and the second winding region B are arranged in this order along the axial direction of the winding core portion 35.

In a technique described in Japanese Unexamined Patent Application Publication No. 2014-120730, in order to address the problem that the mode conversion characteristics deteriorate, the winding structure of the first wire 33 and the second wire 34 in the first winding region A and the winding structure of the first wire 33 and the second wire 34 in the second winding region B are made symmetrical with respect to a center line CL in the switching region C so that pieces of stray capacitance (distributed capacitance) generated between different turns of the first wire 33 and the second wire 34 are balanced. In other words, the number of turns in each of the first wire 33 and the second wire 34 in the first winding region A and the number of turns in each of the first wire 33 and the second wire 34 in the second winding region B are made equal to each other.

Thus, since the capacitance between different turns is uniformly generated for both the first wire 33 and the second wire 34, imbalance between impedances of the first wire 33 and the second wire 34 may be suppressed, whereby mode conversion characteristics are improved and a high quality common mode choke coil may be realized.

SUMMARY

However, according to the technique described in Japanese Unexamined Patent Application Publication No. 2014-120730, there is room for improvement in the mode conversion characteristics. For example, since the electric circuit formed by the common mode choke coil 31a is divided into two of a first half and a second half with respect to an advancing direction of a signal, the deviation of stray capacitance between different turns is suppressed in a macroscopic view, that is, in entire turns. However, the stray capacitance between different turns is generated in a local view, that is, for example, when a first half or a second half alone is examined As a result, as illustrated in FIG. 4, which will be described later, the inventor of the present embodiment has discovered that the mode conversion characteristics gradually deteriorate in a high frequency range.

Therefore, the present disclosure provides a common mode choke coil capable of significantly improving the degree of freedom in generating stray capacitance between different turns including a configuration capable of reducing local deviation of the stray capacitance between the different turns and capable of improving the mode conversion characteristics.

A common mode choke coil according to an aspect of the present disclosure includes a core including a winding core portion, a first flange portion provided on a first end side in an axial direction of the winding core portion, and a second flange portion provided on a second end side in the axial direction of the winding core portion opposite to the first end side, a first wire, a second wire, a third wire, and a fourth wire each wound helically around the winding core portion. The common mode choke coil further includes a first terminal electrode and a third terminal electrode provided on the first flange portion, and a second terminal electrode and a fourth terminal electrode provided on the second flange portion.

Each of end portions of the first wire and the second wire in the first end side is connected to the first terminal electrode, and each of end portions of the first wire and the second wire in the second end side is connected to the second terminal electrode. Also, each of end portions of the third wire and the fourth wire in the first end side is connected to the third terminal electrode, and each of end portions of the third wire and the fourth wire in the second end side is connected to the fourth terminal electrode.

At least a part of the first wire is wound around the winding core portion to form a first layer, and at least a part of the third wire is wound to form a second layer which locates in an outer peripheral side of the first layer in a recess formed between adjacent turns of the first wire. Also, at least a part of the fourth wire is wound to form a third layer which locates in an outer peripheral side of the second layer in a recess formed between adjacent turns of the third wire, and at least a part of the second wire is wound to form a fourth layer which locates in an outer peripheral side of the third layer in a recess formed between adjacent turns of the fourth wire.

A common mode choke coil according to another aspect of the present disclosure includes a core including a winding core portion, a first flange portion provided on a first end side in an axial direction of the winding core portion, and a second flange portion provided on a second end side in the axial direction of the winding core portion opposite to the first end side, a first wire, a second wire and a third wire each wound helically around the winding core portion. The common mode choke coil further includes a first terminal electrode and a third terminal electrode provided on the first flange portion, and a second terminal electrode and a fourth terminal electrode provided on the second flange portion.

Each of end portions of the first wire and the second wire in the first end side is connected to the first terminal electrode, and each of end portions of the first wire and the second wire in the second end side is connected to the second terminal electrode. Also, an end portion of the third wire in the first end side is connected to the third terminal electrode, and an end portion of the third wire in the second end side is connected to the fourth terminal electrode.

At least a part of the first wire is wound around the winding core portion to form a first layer, at least a part of the third wire is wound to form a second layer which locates in an outer peripheral side of the first layer in a recess formed between adjacent turns of the first wire, and at least a part of the second wire is wound to form a third layer which locates in an outer peripheral side of the second layer in a recess formed between adjacent turns of the third wire.

In a technique described in Japanese Unexamined Patent Application Publication No. 2014-120730, a first winding region and a second winding region where the positional relationship between two wires of a pair is opposite to each other are arranged in an axial direction of a winding core portion. Whereas, in the aspect above, a region corresponding to the first winding region and a region corresponding to the second winding region are stacked in a direction orthogonal to the axial direction of the winding core portion, in brief.

Other features, elements, characteristics and advantages of the present disclosure will become more apparent from the following detailed description with reference to the attached drawings.

DETAILED DESCRIPTION

Figure 1:
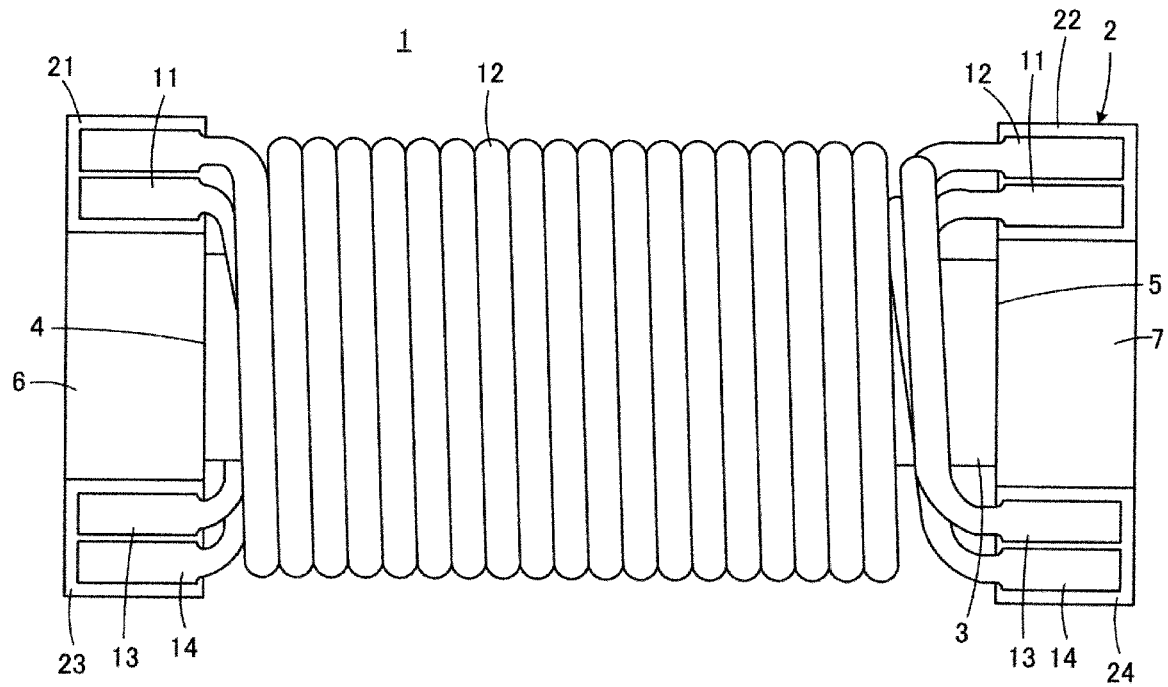
FIG. 1 is a plan view illustrating a common mode choke coil 1 according to a first embodiment viewed from a mounting surface side.
Figure 2:
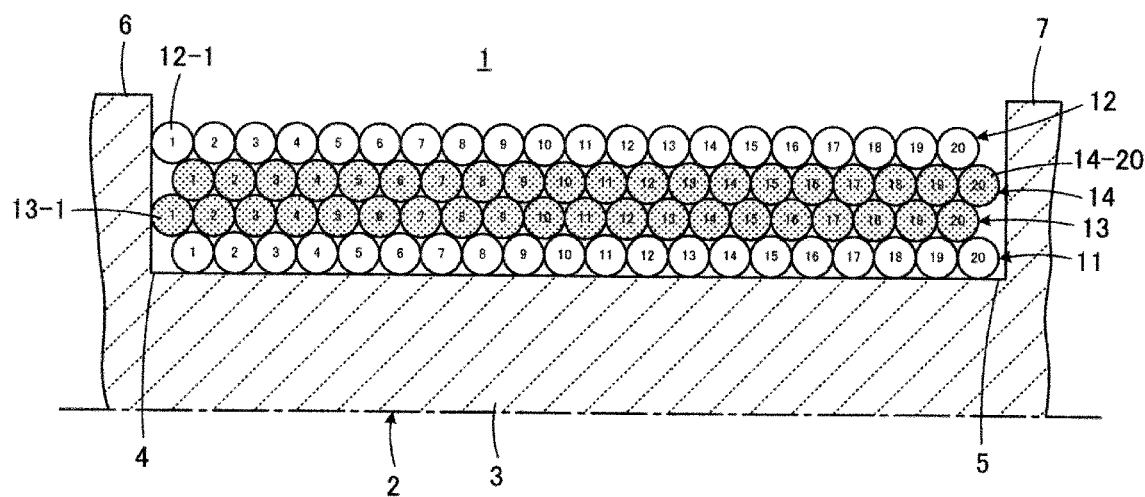
FIG. 2 is a sectional view schematically illustrating a winding state of first to fourth wires in the common mode choke coil 1 illustrated in FIG. 1.

FIG. 1 illustrates a common mode choke coil 1 according to a first embodiment. The common mode choke coil 1 illustrated in FIG. 1 includes a core 2, four wires, that is, a first wire 11, a second wire 12, a third wire 13, and a fourth wire 14 to constitute inductors. FIG. 2 is a schematic sectional view illustrating a winding state of the first wire 11, the second wire 12, the third wire 13, and the fourth wire 14 in the common mode choke coil 1 illustrated in FIG. 1. In FIG. 2, in order to clearly distinguish between the first wire 11 and the second wire 12, and the third wire 13 and the fourth wire 14, cross sections of the first wire 11 and the second wire 12 are illustrated with white inside, and cross sections of the third wire 13 and the fourth wire 14 are hatched.

The core 2 is made of a non-conductive material, more specifically, alumina as a dielectric, Ni—Zn based ferrite as a magnetic material, a resin, or the like. The core 2 has a substantially rectangular cross section as a whole. The wires 11 to 14 are made of, for example, copper coated with an insulator, and have a substantially circular cross section and substantially the same outer diameter. Note that the material and shape of the core 2 and the material, shape and outer diameter of the wires 11 to 14 are not limited to those exemplified herein.

The core 2 includes a winding core portion 3, a first flange portion 6 provided on a side of a first end 4 in an axial direction of the winding core portion 3, and a second flange portion 7 provided on a side of a second end 5 opposite to the first end 4 side. The first wire 11, the second wire 12, the third wire 13 and the fourth wire 14 are helically wound in parallel in substantially the same number of turns from the first end 4 side to the second end 5 side around the winding core portion 3. The reason why the "substantially the same number of turns" is used is that the positions of winding start point or winding end point of the respective wires 11 to 14 on the winding core portion 3 may slightly be shifted each other.

The first flange portion 6 is provided with a first terminal electrode 21 and a third terminal electrode 23, and the second flange portion 7 is provided with a second terminal electrode 22 and a fourth terminal electrode 24. The terminal electrodes 21 to 24 are provided by, for example, baking of a conductive paste, plating of a conductive metal, pasting of a metal plate with an adhesive agent, or the like. The common mode choke coil 1 viewed from the mounting surface side is illustrated in FIG. 1. In FIG. 2, the terminal electrodes 21 to 24 are not illustrated.

The end portions of the first wire 11 and the second wire 12 in the first end 4 side are both connected to the first terminal electrode 21, and the end portions of the first wire 11 and the second wire 12 in the second end 5 side are both connected to the second terminal electrode 22. The end portions of the third wire 13 and the fourth wire 14 in the first end 4 side are both connected to the third terminal electrode 23, and the end portions of the third wire 13 and the fourth wire 14 on the second end 5 side are both connected to the fourth terminal electrode 24. For the connections above, thermocompression bonding or laser welding is adopted, for example.

Figure 9:
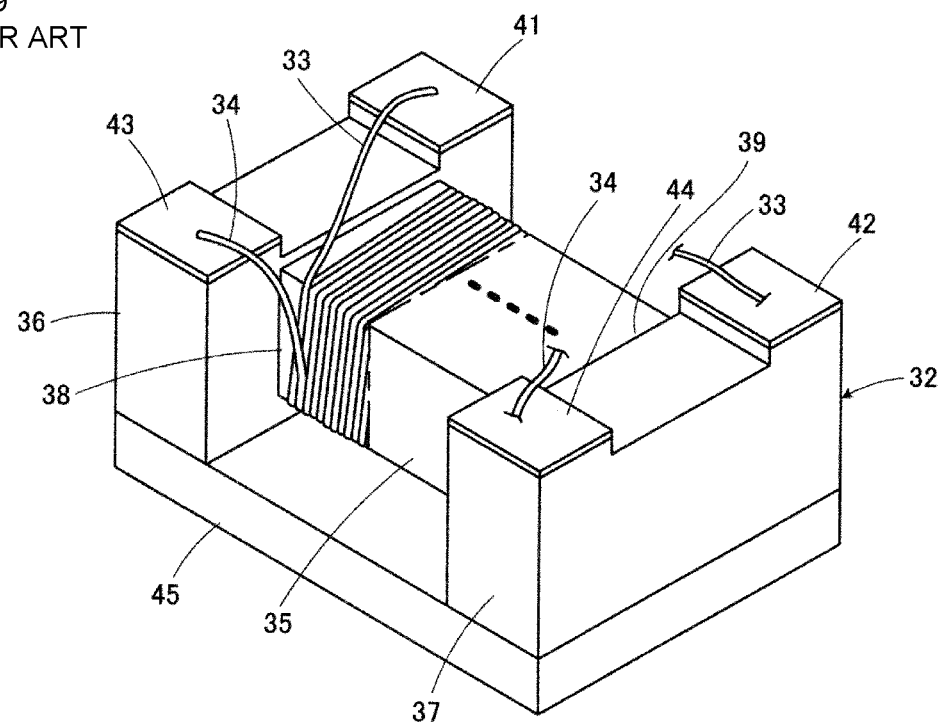
FIG. 9 is a perspective view illustrating the widely used common mode choke coil 31 in a posture in which a mounting surface is directed upward.
Figure 10:
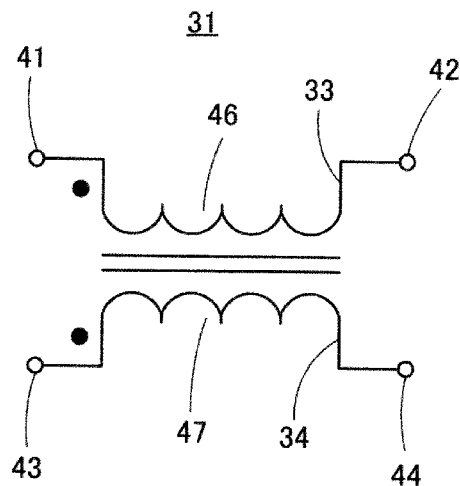
FIG. 10 is an equivalent circuit diagram of the common mode choke coil 31 illustrated in FIG. 9.

The common mode choke coil 1 may include a top plate corresponding to the top plate 45 included in the common mode choke coil 31 illustrated in FIG. 9. Similarly to the core 2, the top plate is made of, for example, alumina as a non-magnetic material, Ni—Zn based ferrite as a magnetic material, a resin, or the like. When the core 2 and the top plate are made of a magnetic material, and the top plate is disposed to connect the first flange portion 6 and the second flange portion 7, the core 2 and the top plate collectively constitute a closed magnetic circuit.

With reference mainly to FIG. 2, the first wire 11 is wound around the winding core portion 3 to form a first layer. The third wire 13 is wound to form a second layer which is in an outer peripheral side of the first layer while a portion thereof, more precisely a portion in the cross sectional plane thereof, is fitted in a recess formed between adjacent turns of the first wire 11. Next, the fourth wire 14 is wound to form a third layer which is in an outer peripheral side of the second layer while a portion thereof, more precisely a portion in the cross sectional plane thereof, is fitted in a recess formed between adjacent turns of the third wire 13. Finally, the second wire 12 is wound to form a fourth layer which is in an outer peripheral side of the third layer while a portion thereof, more precisely a portion in the cross sectional plane thereof, is fitted in a recess formed between adjacent turns of the fourth wire 14.

In FIG. 2, turn numbers "1" to "20" counted from the first end 4 side of the winding core portion 3 is given in each cross section of the first wire 11, the second wire 12, the third wire 13, and the fourth wire 14. The turn number is given in the cross section of the wire also in FIG. 5 and FIG. 7 described later.

When the turn number described above is viewed closely, the first wire 11 forming the first layer and the third wire 13 forming the second layer have a portion where the first wire 11 is positioned closer to the second end 5 side of the winding core portion 3 than the third wire 13 while being adjacent to each other in the respective same turn numbers counted from the first end 4 side of the winding core portion 3. That is, when n is a natural number from 2 to 20, an n-th turn of the third wire 13 is adjacent to an (n−1)-th turn of the first wire 11.

Further, the second wire 12 forming the fourth layer and the fourth wire 14 forming the third layer have a portion where the second wire 12 is positioned closer to the first end 4 side of the winding core portion 3 than the fourth wire 14 while being adjacent to each other in the respective same turn numbers counted from the first end 4 side of the winding core portion 3. That is, when n is a natural number of 1 to 19, the n-th turn of the fourth wire 14 is adjacent to the (n+1)-th turn of the second wire 12.

Figure 3:
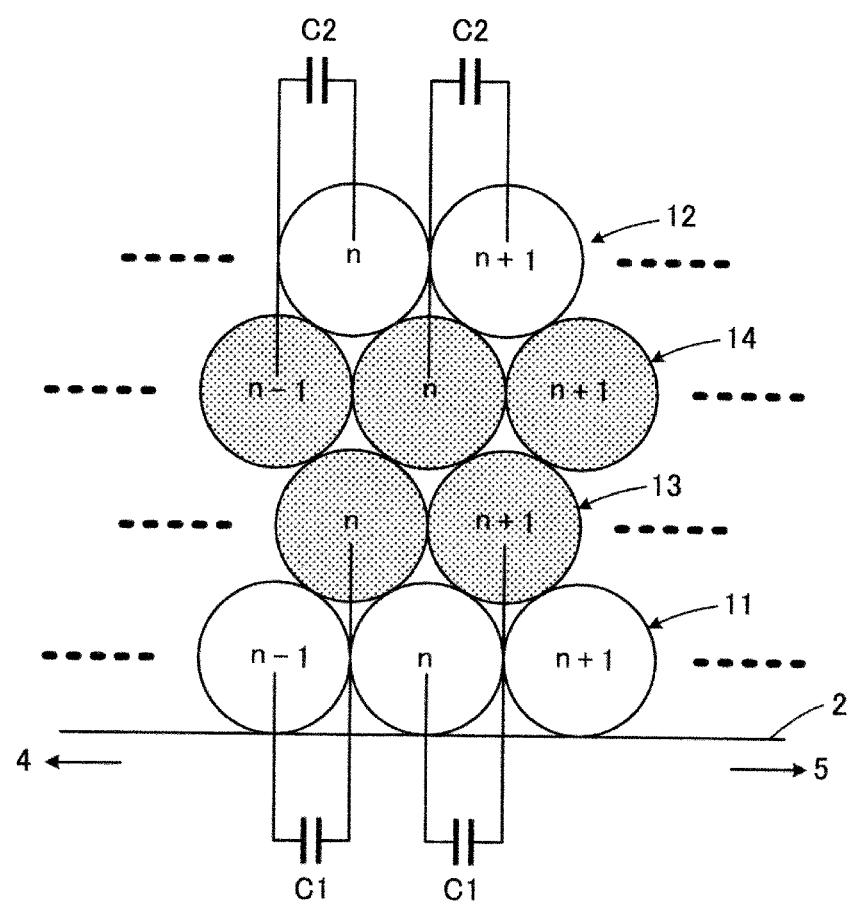
FIG. 3 is an enlarged sectional view of a part of the first to fourth wires in order to describe stray capacitance C1 and C2 generated in the first to fourth wires illustrated in FIG. 2.

Therefore, as illustrated in FIG. 3, between the first wire 11 and the third wire 13, stray capacitance C1 is generated between different turns, and between the second wire 12 and the fourth wire 14, stray capacitance C2 is generated between different turns, where the first wire 11 is connected to the first terminal electrode 21 and the second terminal electrode 22, the third wire 13 is connected to the third terminal electrode 23 and the fourth terminal electrode 24, the second wire 12 is connected to the first terminal electrode 21 and the second terminal electrode 22, and the fourth wire 14 is connected to the third terminal electrode 23 and the fourth terminal electrode 24. Since the first wire 11 and the second wire 12 are connected to the same terminal electrodes in each end and the third wire 13 and the fourth wire 14 are connected to the same terminal electrodes in each end, the first wire 11 and the second wire 12 are electrically connected in parallel and the third wire 13 and the fourth wire 14 are electrically connected in parallel to respectively constitute the same signal line in a differential signal circuit.

With respect to the turn shift between the first wire 11 and the third wire 13 and the turn shift between the second wire 12 and the fourth wire 14, which cause the generation of the stray capacitance C1 and C2 described above, the shift direction of the first wire 11 to the third wire 13 and the shift direction of the second wire 12 to the fourth wire 14 are opposite to each other. In other words, as illustrated in FIG. 3, the n-th turn of the third wire 13 is positioned at the upper left side of the n-th turn of the first wire 11, and the n-th turn of the fourth wire 14 is positioned at the lower right side of the n-th turn of the second wire 12. That is, the stray capacitance C1 between different turns is generated between the n-th turn of the third wire 13 and the (n−1)-th turn of the first wire 11, and the stray capacitance C2 between different turns is generated between the n-th turn of the fourth wire 14 and the (n+1)-th turn of the second wire 12.

As a result, the stray capacitance C1 between the first layer and the second layer and the stray capacitance C2 between the third layer and the fourth layer are generated in a direction opposite to each other. Thus, the stray capacitance C1 and the stray capacitance C2, which are generated in a direction opposite to each other, are generated by using two wires (first wire 11 and second wire 12, third wire 13 and fourth wire 14) which are electrically connected in parallel, in contrast to a technique described in Japanese Unexamined Patent Application Publication No. 2014-120730 where each wire is divided into a first half and a second half. That is, with respect to an n-th turn of one signal line, the stray capacitance C1 and C2 may be generated for both an (n−1)-th turn and an (n+1)-th turn of the other signal line. Therefore, in the common mode choke coil 1, the deviation of the stray capacitance is reduced not only in a macroscopic view, that is, in an entire signal line but also in a local region, specifically in each turn unit. Thus, it is possible to improve the mode conversion characteristics up to a high frequency range.

Figure 4:
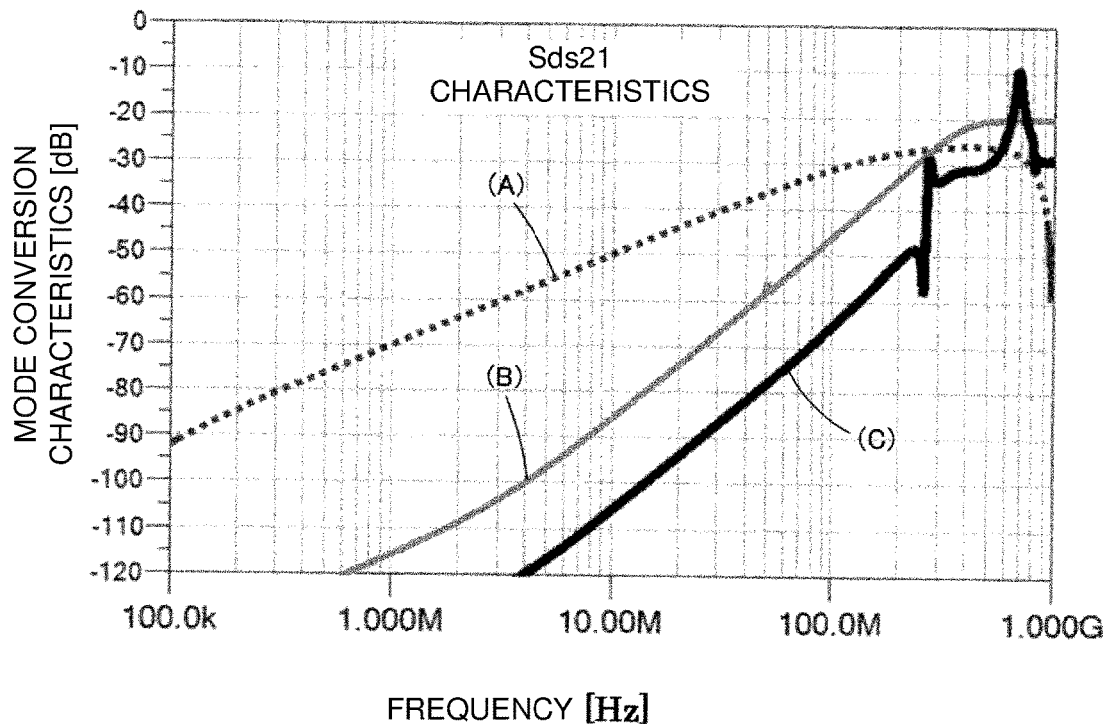
FIG. 4 is a diagram illustrating frequency characteristics of mode conversion characteristics of common mode choke coils, and (A) illustrates characteristics of a common mode choke coil employing two layers winding called layer winding described in Japanese Unexamined Patent Application Publication No. 2014-120730 as a comparative example, (B) illustrates characteristics of a common mode choke coil according to the first embodiment described in Japanese Unexamined Patent Application Publication No. 2014-120730 as another comparative example and (C) illustrates characteristics of a common mode choke coil as an example according to the present disclosure.

The frequency characteristics of the mode conversion characteristics of the common mode choke coils obtained by a simulation are illustrated in FIG. 4. In FIG. 4, (A) illustrates the characteristics of a common mode choke coil which adopts the two layers winding called the layer winding described in Japanese Unexamined Patent Application Publication No. 2014-120730 as a comparative example, (B) illustrates the characteristics of the common mode choke coil according to the first embodiment described in Japanese Unexamined Patent Application Publication No. 2014-120730 as another comparative example, and (C) illustrates the characteristics of the common mode choke coil which is an example according to the present disclosure. The characteristics above are obtained for common mode choke coils whose number of wire turns is 10.

As illustrated in FIG. 4, compared with the mode conversion characteristics (A) of the common mode choke coil adopting the two layers winding called the layer winding described in Japanese Unexamined Patent Application Publication No. 2014-120730, the mode conversion characteristics (B) of the common mode choke coil according to the first embodiment described in Japanese Unexamined Patent Application Publication No. 2014-120730 and the mode conversion characteristics (C) of the common mode choke coil as an example according to the present disclosure are improved. Further, the mode conversion characteristics (C) of the common mode choke coil as an example according to the present disclosure is improved by approximately 20 dB compared with the mode conversion characteristics (B) of the common mode choke coil according to the first embodiment described in Japanese Unexamined Patent Application Publication No. 2014-120730.

Among improvement effects described above, the improvement effect in a high frequency range is due to the reduction in local deviation in the stray capacitance between the different turns described above, and the improvement effect in a low frequency range is due to the reduction of difference in inductance between different signal lines.

In the common mode choke coil adopting the two layers winding called the layer winding described in Japanese Unexamined Patent Application Publication No. 2014-120730 and in the common mode choke coil according to the first embodiment described in Japanese Unexamined Patent Application Publication No. 2014-120730, a first wire always forms a first layer and a second wire always forms a second layer. In this case, since the winding diameter of a wire is larger in the second layer, differences between the first wire and the second wire are generated in a wire line length and a distance of the wire from the core, thereby causing a slight difference in inductance. On the other hand, the differences in the wire line length and the distance of the wire from the core are reduced in an average in the common mode choke coil 1 as an example according to the present disclosure since one signal line is formed of the first wire 11 and the second wire 12, that is, an innermost first layer and an outermost fourth layer, and the other signal line is formed of the third wire 13 and the fourth wire 14, that is, intermediate second layer and third layer, whereby the difference in inductance is reduced. Thus, in the common mode choke coil 1 as an example according to the present disclosure, the mode conversion characteristics in a low frequency range may also be improved.

In the common mode choke coil 1, since both the third wire 13 and the fourth wire 14 forming the intermediate second and third layer are connected to the third terminal electrode 23 and the fourth terminal electrode 24 in each end, it is not required to deeply consider the stray capacitance (distributed capacitance). However, when turns of the same number of the respective third wire 13 and fourth wire 14 are largely spaced apart from each other, the electric potential difference between the third wire 13 and the fourth wire 14 may not be ignored and a problem of stray capacitance may be generated. In order to avoid the problem, in the embodiment illustrated in FIG. 2, the third wire 13 and fourth wire 14 have a portion where the third wire 13 is positioned closer to the first end 4 side than the fourth wire 14 while being adjacent to each other in the respective same turn numbers counted from the first end 4 side. The positional relationship may be reversed as illustrated in FIG. 5 described below.

Figure 5:
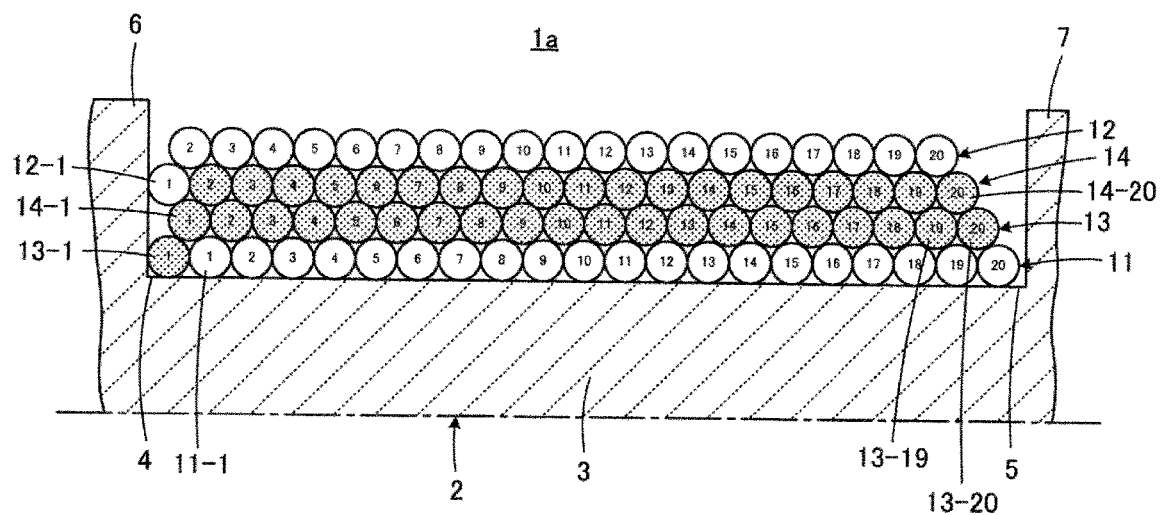
FIG. 5 is a sectional view schematically illustrating a winding state of the first to fourth wires in a common mode choke coil 1a as a modification example of the common mode choke coil 1 illustrated in FIG. 2.

A modification example of the common mode choke coil 1 illustrated in FIG. 2 is illustrated in FIG. 5. FIG. 5 is a diagram corresponding to FIG. 2. In FIG. 5, elements corresponding to those illustrated in FIG. 2 are denoted by the same reference symbols, and repeated description will be omitted.

In a common mode choke coil 1a illustrated in FIG. 5, winding modes of the wires 11 to 14 are different from those of the common mode choke coil 1 illustrated in FIG. 2. In the winding modes of the wires 11 to 14 illustrated in FIG. 2, a first turn 13-1 of the third wire 13, a twentieth turn 14-20 of the fourth wire 14, and a first turn 12-1 of the second wire 12 are not firmly fixed since the winding core portion or wire to stably support them respectively does not exist. Therefore, with respect to the first turn 13-1 of the third wire 13, the twentieth turn 14-20 of the fourth wire 14, and the first turn 12-1 of the second wire 12 described above, it is hard to wind in a stable state and to maintain the wound position.

In contrast, in the winding modes of the wires 11 to 14 illustrated in FIG. 5, the first turn 13-1 of the third wire 13 is positioned on the winding core portion 3 in the first end 4 side of a first turn 11-1 of the first wire 11. In addition, the twentieth turn 14-20 of the fourth wire 14 is fitted into a recess formed between a nineteenth turn 13-19 and a twentieth turn 13-20 of the third wire 13. Therefore, it is possible to stably maintain the wound position for all the turns of all the wires 11 to 14.

Although the first turn 12-1 of the second wire 12 is illustrated being not firmly fixed, the first turn 12-1 of the second wire 12 may be fitted between a first turn 14-1 of the fourth wire 14 and the first flange portion 6. Since the first turn 14-1 of the fourth wire 14 is fitted into a recess formed between the first turn 11-1 of the first wire 11 and the first turn 13-1 of the third wire 13, it is possible to stably maintain the position.

The winding mode illustrated in FIG. 5 is highly likely to be employed in a practical winding process.

In the embodiment illustrated in FIG. 5, the third wire 13 and the fourth wire 14 have a portion where the third wire 13 is positioned closer to the second end 5 side than the fourth wire 14, while being adjacent to each other in the respective same turn numbers counted from the first end 4 side. This positional relationship is opposite to the positional relationship between the third wire 13 and the fourth wire 14 illustrated in FIG. 2. However, it is needless to say that the same effect as in the embodiment illustrated in FIG. 2 is maintained also in the embodiment illustrated in FIG. 5.

In the common mode choke coil 1 illustrated in FIG. 2 and the common mode choke coil 1a illustrated in FIG. 5, the first wire 11, the second wire 12, the third wire 13 and the fourth wire 14 are all substantially circular in cross section and have substantially the same outer diameter. Thus, there may be stabilized the winding state of an upper layer side wire with respect to a lower layer side wire, that is, the winding state of the third wire 13 as an upper layer side wire with respect to the first wire 11 as a lower layer side wire, the fourth wire 14 as an upper layer side wire with respect to the third wire 13 as a lower layer side wire, and the second wire 12 as an upper layer side wire with respect to the fourth wire 14 as a lower layer side wire.

Figure 11:
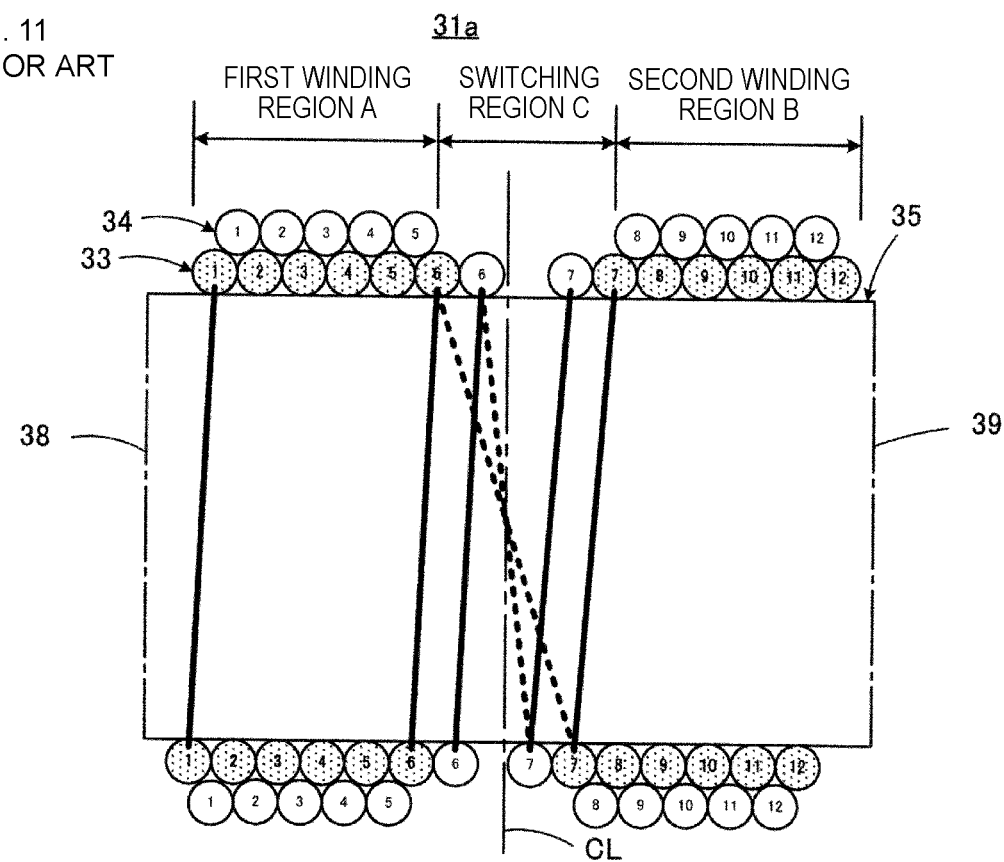
FIG. 11 is a sectional view schematically illustrating a winding state of the first and second wires 33 and 34 in the common mode choke coil 31a described in Japanese Unexamined Patent Application Publication No. 2014-120730.

In addition, in the common mode choke coil 1 illustrated in FIG. 2 and the common mode choke coil 1a illustrated in FIG. 5, it is not required to provide a region where a plurality of wires intersects, such as the switching region C in the common mode choke coil 31a illustrated in FIG. 11. Therefore, in compared with the common mode choke coil 31a illustrated in FIG. 11, in the case of the common mode choke coils 1 and 1a, it is easier to be manufactured and it is possible to further reduce the possibility of deterioration in the quality of wire with such as damage to an insulation coating layer 18 (refer to FIG. 8) in the wires 11 to 14.

Figure 6:
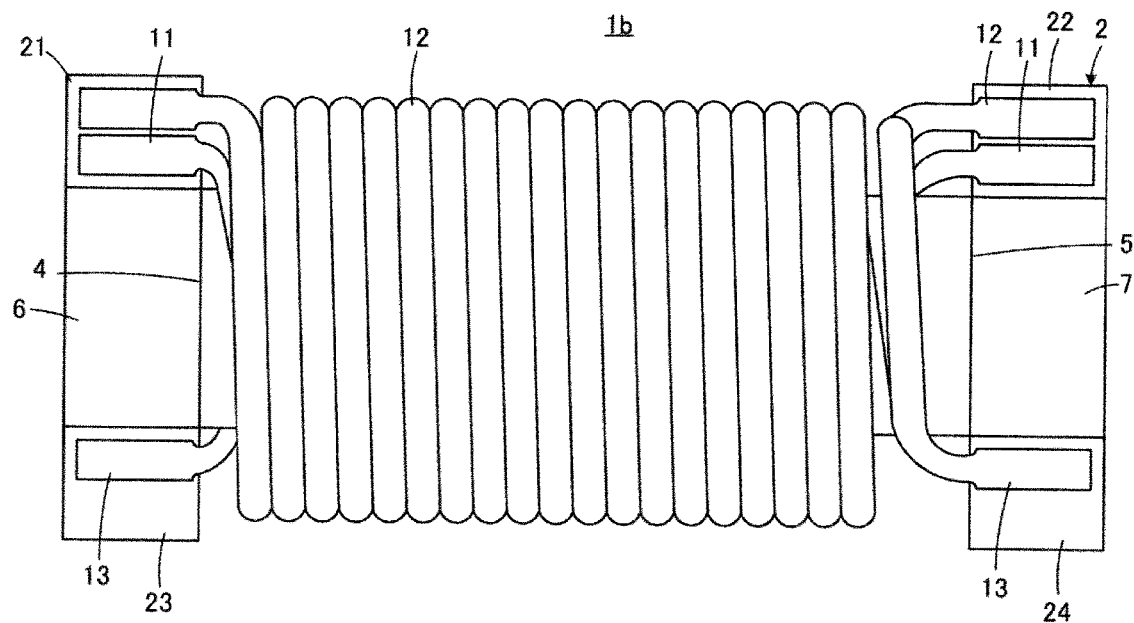
FIG. 6 is a plan view illustrating a common mode choke coil 1b according to a second embodiment viewed from a mounting surface side.
Figure 7:
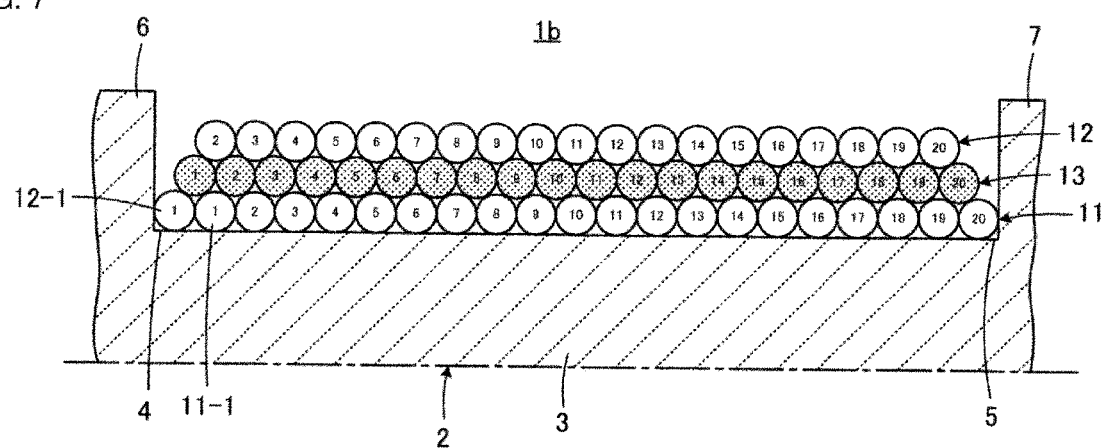
FIG. 7 is a sectional view schematically illustrating a winding state of the first to third wires in the common mode choke coil 1b illustrated in FIG. 6.
Figure 8:
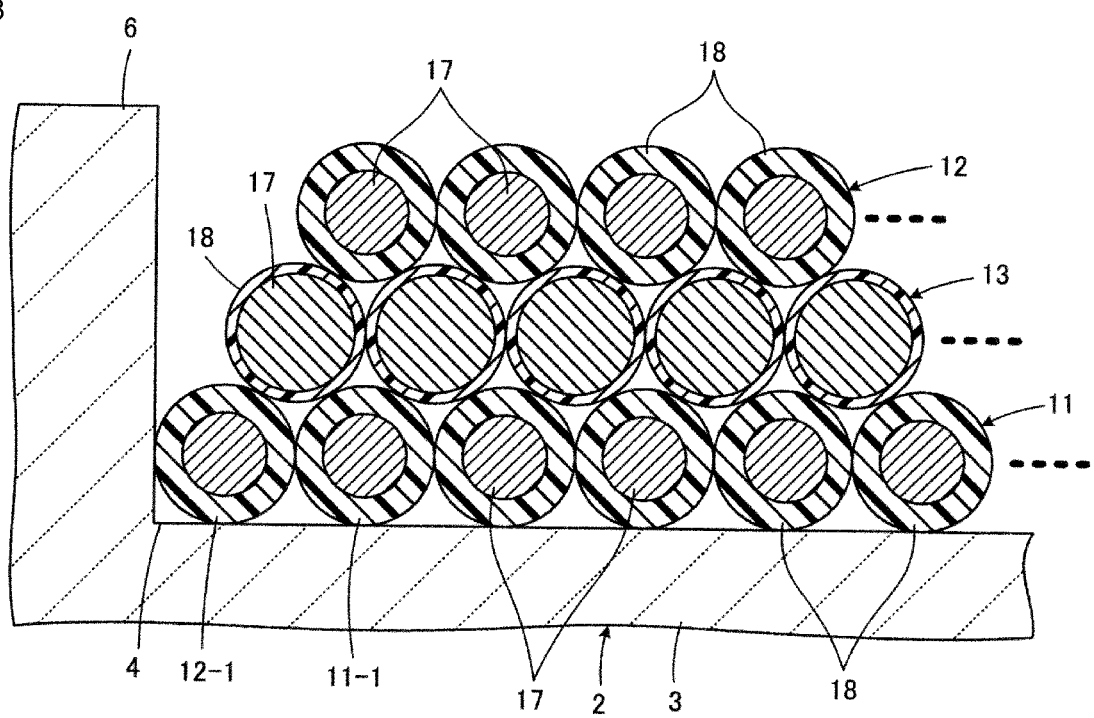
FIG. 8 is an enlarged sectional view of a part of the first to third wires in order to describe the dimensional relationship between a central conductive line and an insulation coating layer of the first to third wires illustrated in FIG. 7.

Next, a common mode choke coil 1b according to a second embodiment will be described with reference to FIG. 6 to FIG. 8. FIG. 6 corresponds to FIG. 1, and FIG. 7 corresponds to FIG. 2. In FIG. 6 to FIG. 8, elements corresponding to those illustrated in FIG. 1 and FIG. 2 are denoted by the same reference symbols, and repeated description will be omitted.

The common mode choke coil 1b is provided with three wires as a feature. In short, a feature of the common mode choke coil 1b according to the second embodiment is that the roles of the third wire 13 and the fourth wire 14 in the common mode choke coil 1 according to the first embodiment described above are achieved by the third wire 13 alone. Therefore, according to the second embodiment, it is possible to further simplify the winding process of the wire compared to the first embodiment.

The common mode choke coil 1b includes the core 2, three wires, that is, the first wire 11, the second wire 12, and the third wire 13. In FIG. 7, in order to clearly distinguish between the first wire 11 and the second wire 12, and the third wire 13, cross sections of the first wire 11 and the second wire 12 are illustrated with white inside, and a cross section of the third wire 13 is hatched.

Similarly to the core 2 in the first embodiment, the core 2 has the winding core portion 3, the first flange portion 6 provided on the first end 4 side in an axial direction of the winding core portion 3, and the second flange portion 7 provided on the second end 5 side opposite to the first end 4 side. The first wire 11, the second wire 12 and the third wire 13 are helically wound in parallel with each other in substantially the same number of turns from the first end 4 side to the second end 5 side around the winding core portion 3.

As in the case of the core 2 in the first embodiment, the first terminal electrode 21 and the third terminal electrode 23 are provided on the first flange portion 6, and the second terminal electrode 22 and the fourth terminal electrode 24 are provided on the second flange portion 7. In FIG. 7, the terminal electrodes 21 to 24 are not illustrated.

The end portions of the first wire 11 and the second wire 12 in the first end 4 side are both connected to the first terminal electrode 21, and the end portions of the first wire 11 and the second wire 12 in the second end 5 side are both connected to the second terminal electrode 22. The end portion of the third wire 13 in the first end 4 side is connected to the third terminal electrode 23, and the end portion of the third wire 13 in the second end 5 side is connected to the fourth terminal electrode 24.

In the common mode choke coil 1b, a top plate corresponding to the top plate 45 illustrated in FIG. 9 may also be provided.

As illustrated in FIG. 7, the first wire 11 is wound around the winding core portion 3 to form a first layer. The third wire 13 is wound to form a second layer which is in an outer peripheral side of the first layer while a portion thereof, more precisely a portion in the cross sectional plane thereof, is fitted in a recess formed between adjacent turns of the first wire 11. Next, the second wire 12 is wound to form a third layer which is in an outer peripheral side of the second layer while a portion thereof, more precisely a portion in the cross sectional plane thereof, is fitted in a recess formed between adjacent turns of the third wire 13.

With respect to the first wire 11 forming the first layer and the third wire 13 forming the second layer, the first wire 11 is positioned closer to the second end 5 side of the winding core portion 3 than the third wire 13 while being adjacent to each other in the same turn numbers counted from the first end 4 side of the winding core portion 3.

In addition, with respect to the second wire 12 forming the third layer and the third wire 13 forming the second layer, the second wire 12 is positioned closer to the first end 4 side of the winding core portion 3 than the third wire 13 while being adjacent to each other in the same turn numbers counted from the first end 4 side of the winding core portion 3. Note that the first turn 12-1 of the second wire 12 is positioned in the first end 4 side of the first turn 11-1 of the first wire 11 and positioned on the winding core portion 3. Such a winding mode is highly likely to be employed in a practical winding process similarly to the winding mode illustrated in FIG. 5.

In the common mode choke coil 1b according to the second embodiment, the stray capacitance between the first layer and the second layer and the stray capacitance between the second layer and the third layer are generated in directions opposite to each other. Similarly to the case of the first embodiment described above, the two types of stray capacitance in directions opposite to each other are generated by using two wires (first wire 11 and second wire 12) which are electrically connected in parallel. That is, with respect to an n-th turn of one signal line, the stray capacitance C1 and C2 may be generated for both an (n−1)-th turn and an (n+1)-th turn of the other signal line. Therefore, also in the common mode choke coil 1b, the deviation of the stray capacitance is reduced not only in a macroscopic view, that is, in an entire signal line but also in a local region, specifically in each turn unit. Thus, it is possible to improve the mode conversion characteristics up to a high frequency range.

The common mode choke coil 1b according to the second embodiment includes a first inductor constituted by the first wire 11 and the second wire 12 whose respective ends are connected to the first terminal electrode 21 and the second terminal electrode 22, and a second inductor constituted by the third wire 13 whose ends are connected to the third terminal electrode 23 and the fourth terminal electrode 24. In the case described above, when the first wire 11, the second wire 12 and the third wire 13 are made of wires with the same specification, a difference is generated between the direct current resistance of the first inductor and the direct current resistance of the second inductor.

It is possible to further improve the mode conversion characteristics in the common mode choke coil 1b with appropriate measures for the difference in direct current resistance described above. In the second embodiment, it is preferable to adopt the following configuration as a measure.

As illustrated in FIG. 8, each of the first wire 11, the second wire 12 and the third wire 13 includes a central conductive line 17 made of a conductor such as copper having a substantially circular cross section, and the insulation coating layer 18 having an electrical insulation property covering the peripheral surface of the central conductive line 17. Here, the diameter of the central conductive line 17 of the third wire 13 is set to be about √2 times the diameter of the central conductive line 17 of each of the first wire 11 and the second wire 12, that is, about 1.3 times or more and about 1.5 times or less (i.e., from about 1.3 times to about 1.5 times).

By adopting the structure as described above, the sum of cross sectional area of the central conductive line 17 of the first wire 11 and the central conductive line 17 of the second wire 12 may be made equal to or substantially equal to the cross sectional area of the central conductive line 17 of the third wire 13. Thus, the difference in direct current resistance between the first inductor constituted by the first wire 11 and the second wire 12 and the second inductor constituted by the third wire 13 may be made zero or made substantially zero.

In the common mode choke coil 1b, the first wire 11, the second wire 12 and the third wire 13 are all substantially circular in cross section and have substantially the same outer diameter. Similarly to the case of the first embodiment, the condition above contributes to the stabilization of the winding state of an upper layer side wire with respect to a lower layer side wire, that is, each of the winding state of the third wire 13 as an upper layer side wire with respect to the first wire 11 as a lower layer side wire, and the second wire 12 as an upper layer side wire with respect to the third wire 13 as a lower layer side wire.

In addition, similarly to the case of the common mode choke coil 1 illustrated in FIG. 2 and the common mode choke coil 1a illustrated in FIG. 5, in the case of the common mode choke coil 1b, it is not required to provide a portion where a plurality of wires intersects, such as the switching region C in the common mode choke coil 31a illustrated in FIG. 11. Therefore, in the case of the common mode choke coil 1b, it is easier to be manufactured and it is possible to further reduce the possibility of deterioration in the quality of wire with such as damage to the insulation coating layer 18 in the wires 11 to 13 compared with the case of the common mode choke coil 31a illustrated in FIG. 11.

As described above, in the common mode choke coil 1 illustrated in FIG. 2 and the common mode choke coil 1a illustrated in FIG. 5, with respect to the first wire 11 and the third wire 13, the first wire 11 is positioned closer to the second end 5 side than the third wire 13 while being adjacent to each other in the same turn numbers counted from the first end 4 side, and with respect to the second wire 12 and the fourth wire 14, the second wire 12 is positioned closer to the first end 4 side than the fourth wire 14 while being adjacent to each other in the same turn numbers counted from the first end 4 side.

In the common mode choke coil 1b illustrated in FIG. 7, with respect to the first wire 11 and the third wire 13, the first wire 11 is positioned closer to the second end 5 side than the third wire 13 while being adjacent to each other in the same turn numbers counted from the first end 4 side, and with respect to the second wire 12 and the third wire 13, the second wire 12 is positioned closer to the first end 4 side than the third wire 13 while being adjacent to each other in the same turn numbers counted from the first end 4 side.

That is, in any of the common mode choke coils 1, 1a and 1b, two regions, in which positional relationships with respect to two wires in a pair forming adjacent layers are opposite to each other, are stacked in a direction orthogonal to an axial direction of the winding core portion. Therefore, compared with the technique described in Japanese Unexamined Patent Application Publication No. 2014-120730, it is possible to make the degree of unevenness of the distributed capacitance lower and the mode conversion characteristics may be improved up to a higher frequency range.

In addition, in any of the common mode choke coils 1, 1a and 1b, a structure is adopted in which one wire is shifted by one turn from the other wire with respect to two wires in a pair forming adjacent layers while being adjacent to each other in the same turn numbers. With this, when a structure is employed in which one turn alone is shifted, it is possible to make stray capacitance generated between the two wires described above minimum.

However, in the present disclosure, with respect to two wires in a pair forming the adjacent layers, it is not limited to a configuration in which wires in the same turn numbers are shifted by one turn, and a configuration in which wires in the same turn numbers are shifted by two or more turns may be employed. With respect to the common mode choke coils 1 and 1a, the turn shift amount between the first wire 11 and the third wire 13 and the turn shift amount between the second wire 12 and the fourth wire 14 may be different from each other. Similarly, with respect to the common mode choke coil 1b, the turn shift amount between the first wire 11 and the third wire 13 and the turn shift amount between the second wire 12 and the third wire 13 may be different from each other.

While the disclosure has been described with reference to the embodiments illustrated in figures, it is to be understood that various modifications are possible within the scope of the present disclosure.

For example, the number of turns of a wire provided in a common mode choke coil may be arbitrarily increased or decreased.

In addition, the counting direction of the number of turns employed in the description of the embodiment may be reversed.

In addition, in a part of a plurality of wires included in a common mode choke coil, there may be an intersecting portion or twist winding portion where wires are twisted together.

The illustrated embodiments are exemplary, and a partial replacement or combination of configurations is possible between different embodiments.

According to the aspect above, with respect to certain turns in the first inductor or the second inductor constituted by the four wires or the three wires, since stray capacitance between different turns may be generated in a plurality of positions, it is possible to significantly improve the degree of freedom in generating stray capacitance between different turns.

While some embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A common mode choke coil comprising:
   a core including a winding core portion, a first flange portion provided on a first end side in an axial direction of the winding core portion, and a second flange portion provided on a second end side in the axial direction of the winding core portion opposite to the first end side;
   a first wire, a second wire, a third wire, and a fourth wire each wound helically around the winding core portion;
   a first terminal electrode and a third terminal electrode provided on the first flange portion each of the first terminal electrode and the third terminal electrode being a single electrode; and
   a second terminal electrode and a fourth terminal electrode provided on the second flange portion, each of the second terminal electrode and the fourth terminal electrode being a single terminal electrode,
   wherein each of end portions of the first wire and the second wire at the first end side is connected to the first terminal electrode, and each of end portions of the first wire and the second wire at the second end side is connected to the second terminal electrode,
   each of end portions of the third wire and the fourth wire at the first end side is connected to the third terminal electrode, each of end portions of the third wire and the fourth wire at the second end side is connected to the fourth terminal electrode,
   at least a part of the first wire is wound around the winding core portion to form a first layer,
   at least a part of the third wire is wound to form a second layer which is at an outer peripheral side of the first layer in a recess formed between adjacent turns of the first wire,
   at least a part of the fourth wire is wound to form a third layer which at an outer peripheral side of the second layer in a recess formed between adjacent turns of the third wire, and
   at least a part of the second wire is wound to form a fourth layer which is at an outer peripheral side of the third layer in a recess formed between adjacent turns of the fourth wire.

2. The common mode choke coil according to claim 1, wherein
   the first wire, the second wire, the third wire, and the fourth wire are wound around the winding core portion with substantially an identical number of turns.

3. The common mode choke coil according to claim 2, wherein
   the first wire and the third wire have a portion where the first wire is positioned closer to the second end side than the third wire while being adjacent to each other in respective identical turn numbers counted from the first end side, and
   the second wire and the fourth wire have a portion where the second wire is positioned closer to the first end side than the fourth wire while being adjacent to each other in respective identical turn numbers counted from the first end side.

4. The common mode choke coil according to claim 2, wherein
   the first wire, the second wire, the third wire, and the fourth wire have a substantially circular cross section and have a substantially identical outer diameter.

5. The common mode choke coil according to claim 1, wherein
   the first wire and the third wire have a portion where the first wire is positioned closer to the second end side than the third wire while being adjacent to each other in respective identical turn numbers counted from the first end side, and
   the second wire and the fourth wire have a portion where the second wire is positioned closer to the first end side than the fourth wire while being adjacent to each other in respective identical turn numbers counted from the first end side.

6. The common mode choke coil according to claim 5, wherein
   the third wire and the fourth wire have a portion where the third wire is positioned closer to the first end side than the fourth wire while being adjacent to each other in respective identical turn numbers counted from the first end side.

7. The common mode choke coil according to claim 6, wherein the first wire, the second wire, the third wire, and the fourth wire have a substantially circular cross section and have a substantially identical outer diameter.

8. The common mode choke coil according to claim 5, wherein
the third wire and the fourth wire have a portion where the third wire is positioned closer to the second end side than the fourth wire while being adjacent to each other in respective identical turn numbers counted from the first end side.

9. The common mode choke coil according to claim 8, wherein
the first wire, the second wire, the third wire, and the fourth wire have a substantially circular cross section and have a substantially identical outer diameter.

10. The common mode choke coil according to claim 5, wherein
the first wire, the second wire, the third wire, and the fourth wire have a substantially circular cross section and have a substantially identical outer diameter.

11. The common mode choke coil according to claim 1, wherein
the first wire, the second wire, the third wire, and the fourth wire have a substantially circular cross section and have a substantially identical outer diameter.

12. The common mode choke coil according to claim 11, wherein
each of the first wire, the second wire, the third wire, and the fourth wire includes a central conductive line made of a conductor having a substantially circular cross section, and an insulation coating layer having an electrical insulation property covering a peripheral surface of the central conductive line,
the central conductive line of each of the first wire, the second wire, the third wire, and the fourth wire has a substantially identical diameter, and
the insulation coating layer of each of the first wire, the second wire, the third wire, and the fourth wire has a substantially identical thickness.

13. A common mode choke coil comprising:
a core including a winding core portion, a first flange portion provided on a first end side in an axial direction of the winding core portion, and a second flange portion provided on a second end side in the axial direction of the winding core portion opposite to the first end side;
a first wire, a second wire, and a third wire each wound helically around the winding core portion;
a first terminal electrode and a third terminal electrode provided on the first flange portion each of the first terminal electrode and the third terminal electrode being a single electrode; and
a second terminal electrode and a fourth terminal electrode provided on the second flange portion, each of the second terminal electrode and the fourth terminal electrode being a single terminal electrode,
wherein each of end portions of the first wire and the second wire at the first end side is connected to the first terminal electrode and each of end portions of the first wire and the second wire at the second end side is connected to the second terminal electrode,
an end portion of the third wire at the first end side is connected to the third terminal electrode and an end portion of the third wire at the second end side is connected to the fourth terminal electrode,
at least a part of the first wire is wound around the winding core portion to form a first layer, at least a part of the third wire is wound to form a second layer which is at an outer peripheral side of the first layer in a recess formed between adjacent turns of the first wire, and
at least a part of the second wire is wound to form a third layer which is at an outer peripheral side of the second layer in a recess formed between adjacent turns of the third wire.

14. The common mode choke coil according to claim 13, wherein
the first wire, the second wire, and the third wire are wound around the winding core portion with substantially identical number of turns.

15. The common mode choke coil according to claim 14, wherein
the first wire and the third wire have a portion where the first wire is positioned closer to the second end side than the third wire while being adjacent to each other in respective identical turn numbers counted from the first end side, and
the second wire and the third wire have a portion where the second wire is positioned closer to the first end side than the third wire while being adjacent to each other in respective identical turn numbers counted from the first end side.

16. The common mode choke coil according to claim 14, wherein
the first wire, the second wire, and the third wire have a substantially circular cross section and have a substantially identical outer diameter.

17. The common mode choke coil according to claim 14, wherein
each of the first wire, the second wire and the third wire includes a central conductive line made of a conductor having a substantially circular cross section and an insulation coating layer having an electrical insulation property covering a peripheral surface of the central conductive line, and
a diameter of the central conductive line of the third wire is from 1.3 times to 1.5 times of a diameter of the central conductive line of each of the first wire and the second wire.

18. The common mode choke coil according to claim 13, wherein
the first wire and the third wire have a portion where the first wire is positioned closer to the second end side than the third wire while being adjacent to each other in respective identical turn numbers counted from the first end side, and
the second wire and the third wire have a portion where the second wire is positioned closer to the first end side than the third wire while being adjacent to each other in respective identical turn numbers counted from the first end side.

19. The common mode choke coil according to claim 13, wherein
the first wire, the second wire, and the third wire have a substantially circular cross section and have a substantially identical outer diameter.

20. The common mode choke coil according to claim 13, wherein
each of the first wire, the second wire and the third wire includes a central conductive line made of a conductor having a substantially circular cross section and an insulation coating layer having an electrical insulation property covering a peripheral surface of the central conductive line, and a diameter of the central conductive line of the third wire is from 1.3 times to 1.5 times of a diameter of the central conductive line of each of the first wire and the second wire.

* * * * *